United States Patent [19]

Roberts, Jr.

[11] 4,281,319
[45] Jul. 28, 1981

[54] DIGITAL-TO-ANALOG CONVERTER

[75] Inventor: Ben D. Roberts, Jr., San Jose, Calif.

[73] Assignee: Ricoh Company, Ltd., Tokyo, Japan

[21] Appl. No.: 164,122

[22] Filed: Jun. 30, 1980

[51] Int. Cl.$^3$ .............................................. H03K 13/11
[52] U.S. Cl. ........................ 340/347 DA; 340/347 AD
[58] Field of Search .... 340/347 DA, 347 M, 347 AD

[56] References Cited

U.S. PATENT DOCUMENTS

| | | | |
|---|---|---|---|
| 3,475,749 | 10/1969 | Plice | 340/347 DA |
| 4,160,244 | 7/1979 | Solomon | 340/347 DA |
| 4,196,420 | 4/1980 | Culmer | 340/347 DA |
| 4,198,622 | 4/1980 | Connolly | 340/347 DA |
| 4,200,863 | 4/1980 | Hodges | 340/347 DA |

OTHER PUBLICATIONS

Check, "Electronics", May 25, 1978, pp. 122–127.
Hamade, "IEEE Journal of Solid–State Circuits", vol. SC-13, No. 6, Dec. 1978, pp. 785–791.
Redfern, "Electronics", Sep. 13, 1979, pp. 134–139.

Primary Examiner—Charles D. Miller
Attorney, Agent, or Firm—Townsend and Townsend

[57] ABSTRACT

A bipolar converter for analog and digital conversion is based on a single-ended MOS chip having a grounded substrate. The MOS chip includes a $2^NR$ ladder and an on-chip output polarity switch which establishes the polarity and range of a separate bipolar output amplifier while it minimizes the number of power supplies. The resolution of the MOS chip is effectively doubled without substantially increasing element count. A matrix decoder is employed in a tree decoder to minimize the physical size and element count of the tree decoder.

8 Claims, 6 Drawing Figures

DIGITAL-TO-ANALOG CONVERTER

BACKGROUND OF THE INVENTION

1. Field of Invention

This invention relates to digital-to-analog converters compatible with standard single-ended metal-oxide-semiconductor (MOS) technology. More particularly, the invention relates to a mono-polar digital-to-analog converter using a ladder resistor network of equal value diffused resistors in a bipolar circuit. Two types of ladder resistor networks have been employed in digital-to-analog and analog-to-digital converter devices. Metal-oxide-semiconductor (MOS) technology was first applied to hybrid analog-to-digital devices using an R-2R ladder in the voltage-switching mode wherein C-MOS switches were employed to drive a high-impedance ladder network. More recently, MOS technology has been employed to construct monolithic analog-to-digital and digital-to-analog converters wherein a multi-tap, diffused-resistor string, or ladder, is utilized between a reference voltage ($V_{ref}$) and ground. A tap was provided for each of the $2^N$ possible analog voltage levels on the ladder. The ladder was therefore nominated the $2^N R$ potentiometric technique.

Known n-MOS and p-MOS resistor ladder digital-to-analog converters employ a large number of switches in a so-called tree decoder to reduce the number of drive lines needed. For example, an 8-bit converter generally requires 256 resistors and 510 analog decoder switches. Twice as many resistors and transistors are required to increase resolution by a single bit. In addition, the resistor ladder and tree decoder switches typically occupy the majority of the total die area of a monolithic digital-to-analog converter device.

Improved techniques are needed for reducing the relatively large size of a monolithic MOS converter, for removing the constraints on power supply levels to obtain a bipolar output, and for increasing the resolution of the converter without substantially increasing the element count.

In a MOS device, the voltage of the substrate must be biased to the most negative supply (for n-channel) or most positive supply (for p-channel), which is determined by the logic power supplies. The analog voltages, normally used for conversion references, must be maintained at a level placing a reverse bias between the references and the substrate. Consequently, the relationship between the reference supplies and the logic supply is constrained such that only reverse bias analog power supplies can be used in connection with a single-ended chip power supply.

It is particularly desirable to reduce the number of resistors required in a resistor ladder, because the on-chip resistance increases substantially as the number of resistors is increased. Oscillation problems can occur at high resistance levels. Hysteresis cannot be used to prevent oscillations because the system comparator must be operated at a precise trip point when the digital-to-analog circuit is used as an analog-to-digital converter. High resistance levels therefore are preferably to be avoided.

2. Description of the Prior Art

Monolithic MOS analog-to-digital converters employing resistor ladders include the National Semiconductor Series ADCO800, including the ADCO816 8-bit C-MOS converter. Another exemplary converter is that used in the Intel 8022 single-chip microprocessor.

Prior art MOS converter techniques are described in the following publications:

Hamade, "A Single Chip All-MOS 8-bit A/D Converter", *IEEE Journal of Solid-State Electronics*, Vol. SC-13 No. 6, Dec. 1978, p. 785.

Check et al., "Microcontroller Includes A-D Converter for Lowest-Cost Analog Interfacing", *Electronics*, May 25, 1978, p. 122.

Redfern et al., "MOS Sampled-Data Technique Shrinks A-D Chip", *Electronics*, Sept., 13, 1979, p. 134.

SUMMARY OF THE INVENTION

An MOS digital-to-analog converter includes an $2^N R$ resistor ladder, a tree decoder in connection with an X-Y matrix decoder which optimizes space saving, and an output polarity switch between the high level and low level voltage reference of the resistor ladder, all of which are constructed on a single MOS chip. Two analog signals are derived from the MOS chip, both of which are coupled to input terminals of an operational amplifier circuit which is capable of amplifying the analog voltage signal and inverting the signal in response to a sign signal from the MOS chip. Further, an operational amplifier buffer circuit on the chip shifts the output voltage range of the tree decoder to a range suitable to be used in bipolar applications. The output polarity switch, which is controlled by the sign bit, effectively doubles the resolution of the converter by controlling the polarity of the output coupled operational amplifier.

The invention has a number of advantages. First of all, it permits analog polarity inversion controlled by the circuitry on the chip. Second, it permits amplification of the analog output signal through an on-chip amplifier. Third, it allows level shifting of the MOS output voltage to a range suitable for bipolar applications.

Fourth, the level shifting and polarity inversion features allow bipolar, that is, positive and negative, analog power supplies to be used in connection with a single-ended chip power supply, effectively doubling the resolution of the circuit for a given resistor ladder network. Fifth, the level shifting and amplification features permit greater latitude in the selection of reference and power supply voltages. For example, a resistor ladder operated between two reference voltage supplies $+V_{ref\,1}$ and $+V_{ref\,2}$, where both are reverse biased relative to the substrate voltage $V_{ss}$, permits the selection of the higher level reference $+V_{ref\,1}$ in a range small enough to assure that the decode gates of the tree decoder have no voltage drop and that the lower level reference $+V_{ref\,2}$ is large enough to be in the common-mode amplification range of the on-chip buffer amplifier.

Sixth, the X-Y decode scheme employed in connection with the tree decoder minimizes the amount of physical area required for the diffused resistor ladder by overlaying multiple contacts and interconnections between the MOS switches in a serpentine resistor ladder.

Further objects and advantages will be apparent by reference to the following detailed description taken in connection with the accompanying drawings.

DETAILED DESCRIPTION OF SPECIFIC EMBODIMENTS

Figure 1:
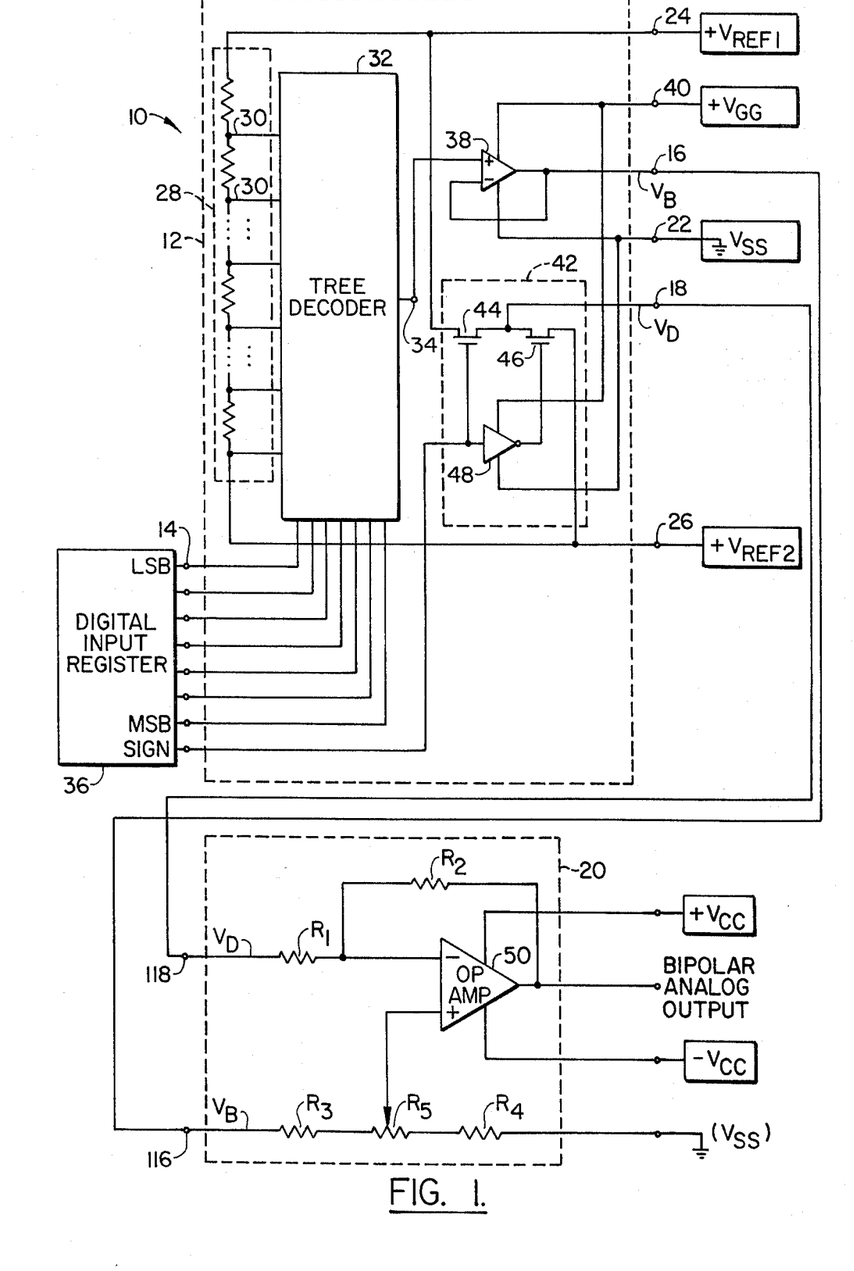
FIG. 1 is a block diagram in partial schematic of an MOS digital-to-analog converter with bipolar output.

FIG. 1 illustrates a particular embodiment of a digital-to-analog converter 10 according to the invention. The digital-to-analog converter 10 comprises a metal-oxide-semiconductor (MOS) chip 12 having a digital input port 14, an analog signal output port 16 and an analog reference level output port 18. In addition, the converter 10 includes a dual input bipolar analog signal amplifier 20. The two signal output ports 16, 18 of the chip 12 are coupled to the two inputs 116 and 118 of the amplifier 20.

The MOS chip 12 is essentially a mono-polar device. In this embodiment the substrate is of the p-type which must be tied to the most negative voltage source in order for the chip 12 to operate properly. In the device according to the invention, the substrate voltage $V_{ss}$ is established at ground potential thereby eliminating a logic power supply. Terminals 24 and 26 are provided for two analog reference voltage levels, namely $+V_{ref\,1}$ and $+V_{ref2}$, respectively. The higher analog reference voltage, $+V_{ref\,1}$, is connected to one end of a resistor ladder 28 through terminal 24. The lower analog voltage reference supply, $+V_{ref2}$, which is also a potential above ground, is coupled to the opposing end of the resistor ladder 28 through terminal 26. Taps 30 along the resistor ladder 28 are coupled through a tree decoder 32 to a common output node 34. The tree decoder is controlled through the selected digital input signal lines through digital input port 14. The source of the digital input code is generally a digital input register 36, which may also be a successive approximation register. The digital input register 36 may be off-chip as shown in FIG. 1, or it may be constructed as part of the MOS chip 12.

The common node 34 is coupled through a buffer 38 on the MOS chip 12 to the analog output terminal 16 supplying the $V_B$ analog voltage. The buffer 38 serves an impedance transformer of the relatively high impedance voltage level at node 34. The buffer 38 is coupled to a supply voltage $+V_{gg}$ through a terminal 40.

According to the invention, an output polarity switch 42 is provided on the MOS chip 12. The output polarity switch 42 responds to a digital sign bit applied at the input port 14 to switch an analog output voltage $V_D$ at terminal 18 between the high analog reference level $+V_{ref\,1}$ and the low analog voltage reference level $+V_{ref2}$. The output $V_D$ is applied to the bipolar amplifier 20 as a polarity switching signal.

The output polarity switch 42 comprises a first MOS switch 44, a second MOS switch 46 and an inverter 48. The drain terminal of the first MOS switch 44 is tied to the first analog reference voltage level $+V_{ref\,1}$. Its source terminal is tied to the drain terminal of the second MOS switch 46 and to the output terminal 18 supplying the signal $V_D$. The source terminal of the second MOS switch 46 is tied to the lower analog reference voltage $+V_{ref\,2}$. The gate terminal of the first MOS switch 44 is tied to the sign bit control line of digital input port 14 and to the input of the inverter 48. The output of the inverter 48 is coupled to the gate of the second MOS switch 46.

The bipolar amplifier 20 comprises a dual input operational amplifier 50 with resistive negative feedback and matched resistive input impedance at the differential inputs. The operational amplifier 50 is powered by positive and negative power supplies $+V_{cc}$ and $-V_{cc}$ such that its output signal is operational over a positive as well as a negative voltage range. The noninverting input signal is derived from a voltage divider, one terminal of which may be tied to the digital ground reference $V_{ss}$ through a resistor $R_4$ and the other terminal being tied to one of the signal outputs of the MOS chip 12. Alternatively, the resistor $R_4$ may be coupled to a separate analog ground supply reference instead of the $V_{ss}$ voltage. The $V_{ss}$ voltage is primarily a digital level ground reference, and therefore is subject to noise which makes it unsuited as an analog signal path ground. In the embodiment of FIG. 1, the analog signal output $V_B$ is coupled to the noninverting input terminal of the operational amplifier 50. The other output signal $V_D$ is coupled to the inverting input through a resistor $R_1$.

In operation, a digital input signal is provided at the input port 14 to the tree decoder 32. The tree decoder 32 selects the corresponding voltage level in the divider network of the resistor ladder 28 between $+V_{ref\,1}$ and $+V_{ref2}$, supplying the voltage to the input of the buffer 38. The output of the buffer 38 is the voltage level $V_B$. The sign bit of the digital input is provided to the gate of the first MOS switch 44 and through the inverter 48 to the gate of the second MOS switch 46. Depending upon the logic state of the sign, the first and second MOS switches 44 and 46 are alternately on or off thereby establishing the voltage $V_D$ either at the high reference $+V_{ref\,1}$ or at the low reference $+V_{ref2}$. The voltages $V_B$ and $V_D$ are then supplied to the operational amplifier-based dual input bipolar amplifier 20 which converts the graduated mono-polar analog signal $V_B$ into a bipolar analog output signal, depending solely upon the level of the polarity voltage signal $V_D$. The amplifier 20 also provides a convenient means whereby the amplitude of the output of the MOS chip can be modified, either by attenuation or amplification, without disrupting the optimum analog reference voltage levels. This flexibility in amplitude and polarity of signal is not found in prior art MOS converters.

There is an optimum upper and lower analog voltage reference level for an analog-to-digital MOS converter which is determined to some extent by the number of bits to be converted plus the desired accuracy of the conversion. Specifically, the higher reference voltage $+V_{ref\,1}$ is preferably small enough so that there is no voltage drop across the tree decoder between the specific taps 30 and the output node 34. The lower voltage reference $+V_{ref\,2}$ is preferably only large enough in absolute magnitude (where $V_{ss}$ is at ground potential) to be in the common mode amplification range of the buffer 38. In this manner, the full voltage range of the resistor ladder is available on both positive and negative swings from essentially zero voltage.

Figure 2:
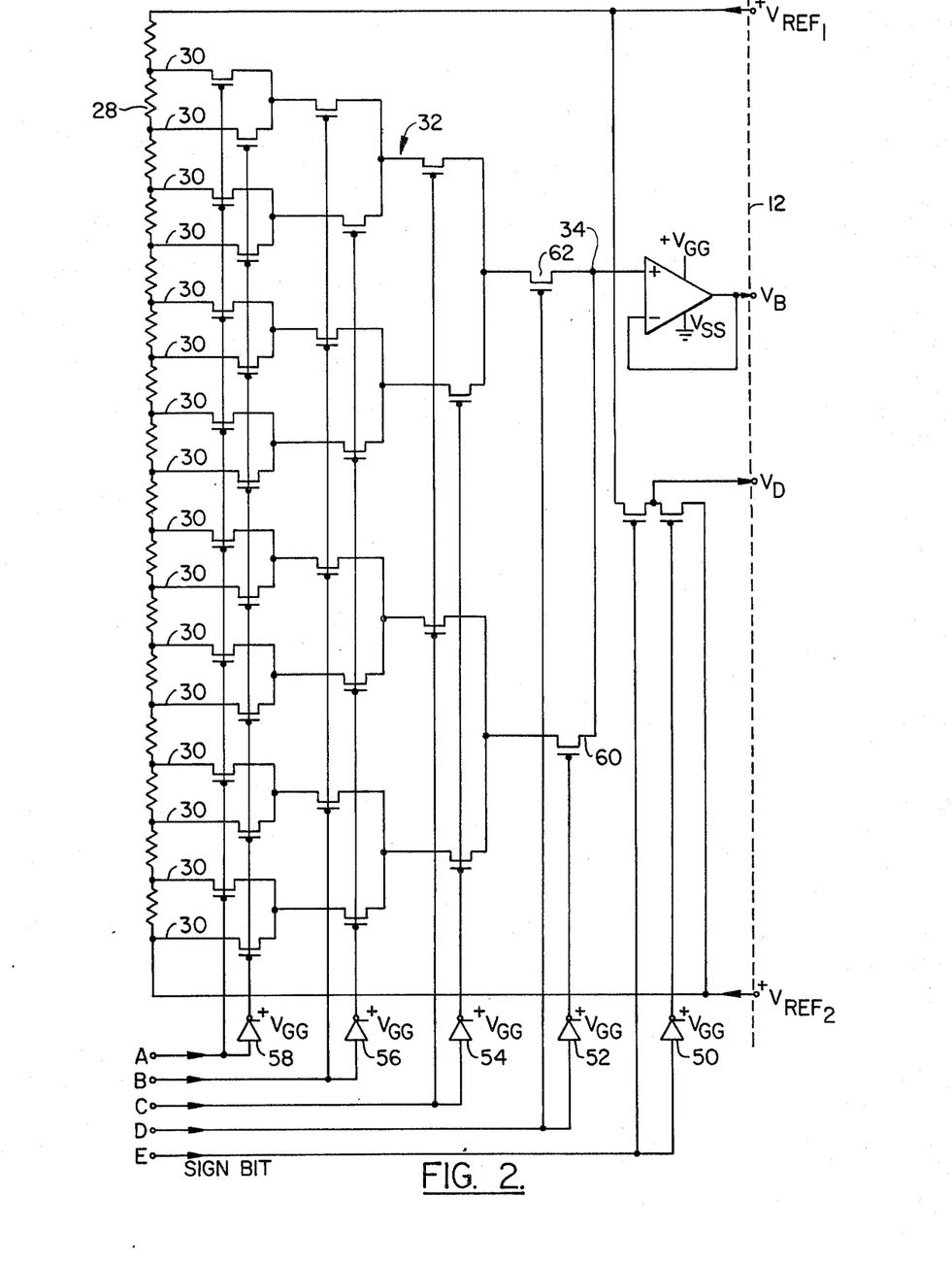
FIG. 2 is a schematic diagram of a 5-bit resistor ladder MOS converter as may be used in a device according to FIG. 1.

Turning to FIG. 2, there is shown a schematic diagram of a specific MOS chip 12 of the type used in the circuit of FIG. 1. The device depicted is for use in a 5-bit converter. The resistor ladder 28 comprises a continuous resistor with sixteen taps 30 to a tree decoder 32. The tree decoder 32 comprises pairs of MOS switches having gates driven by complementary inverters 52, 54, 56, 58. For example, MOS switches 60 and 62 controlled by inverter 52 are each coupled to a tree of similarly paired switches. Where switch 60, for instance, is on and switch 62 is off, the tree coupled to the drain of switch 60 is connected to the node 34. In this manner, any one of the taps 30 can be singled out and coupled to the node 34. Since in a MOS device, there is virtually no voltage drop across an MOS switch for selected voltage reference level when the switch is on, the voltage at the selected tap 30 is virtually the same as the voltage applied at the node 34.

The advantage of the polarity switch in the invention will now be apparent as follows. In the prior art tree decoder, the addition of one bit of resolution required doubling the number resistors and switches. According to this invention, the addition of one bit of resolution requires only the addition of two switches, as well as the inverter 50, to the chip. Hence, in comparison with a device of the same resolution, reliability is greater and chip size is less, which offsets any alleged disadvantage of addition of a bipolar output amplifier.

Figure 3:
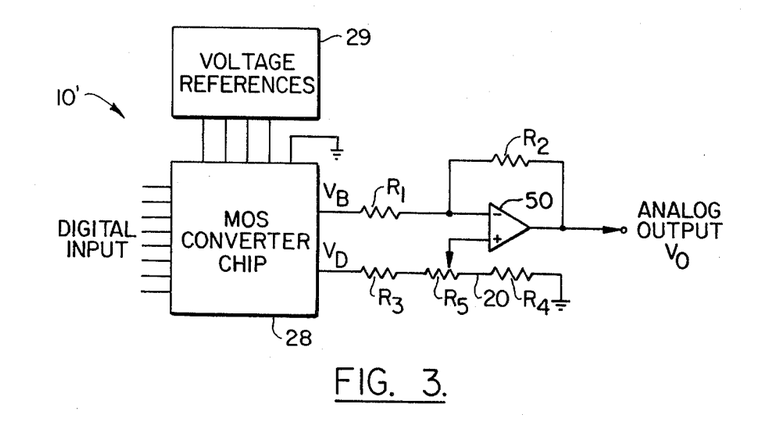
FIG. 3 is a block diagram of an embodiment of a digital-to-analog circuit wherein the digital output is non-inverting.

FIG. 3 illustrates a further embodiment of the converter 10' in which the analog output of the bipolar amplifier 20 is noninverting as compared to the inverting analog output of the converter 10 of FIG. 1. The converter 10' of FIG. 3 employs the same MOS chip 28, output amplifier and voltage references 29. However, the analog output signals of the converter chip 28, namely $V_B$ and $V_D$, are modified. Specifically, the polarity $V_D$ is coupled through the divider network of $R_4$ and $R_5$ to the noninverting input of operational amplifier 50, and the graduated amplitude output $V_B$ is coupled to the inverting input through input resistor $R_1$. Thus only two couplings are reversed to achieve inversion.

Figure 4:
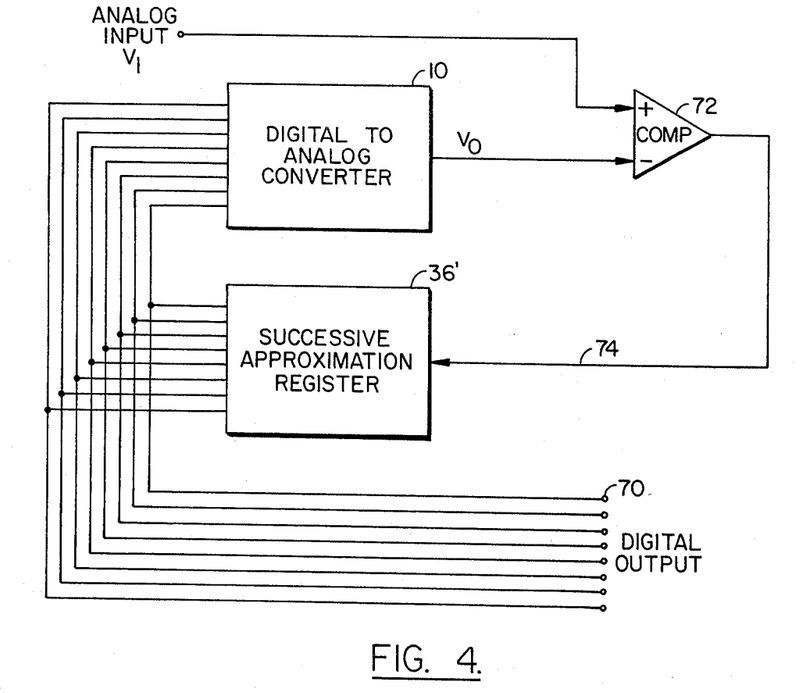
FIG. 4 is an example of an application of the inventive circuit as an analog-to-digital converter.

The converter 10 or 10' can also be employed in an analog-to-digital converter. For example, as shown in FIG. 4, the digital-to-analog converter 10 is coupled at its digital input to a successive approximation register 36' of conventional configuration. The digital output of the successive approximation register 36' may be applied to an output port 70. The analog output $V_o$ of the converter 10 is coupled to one input of a dual input comparator 72, the other input of which is the analog input $V_i$ which is to be converted to a digital representation at the digital output port 70. The analog input $V_i$ and the converter output $V_o$ dictate the output state of the comparator 72, the output of which is coupled via a control line 74 to the successive approximation register 36'. The converter 10 according to the invention thus has universal analog and digital conversion applications.

Figure 5:
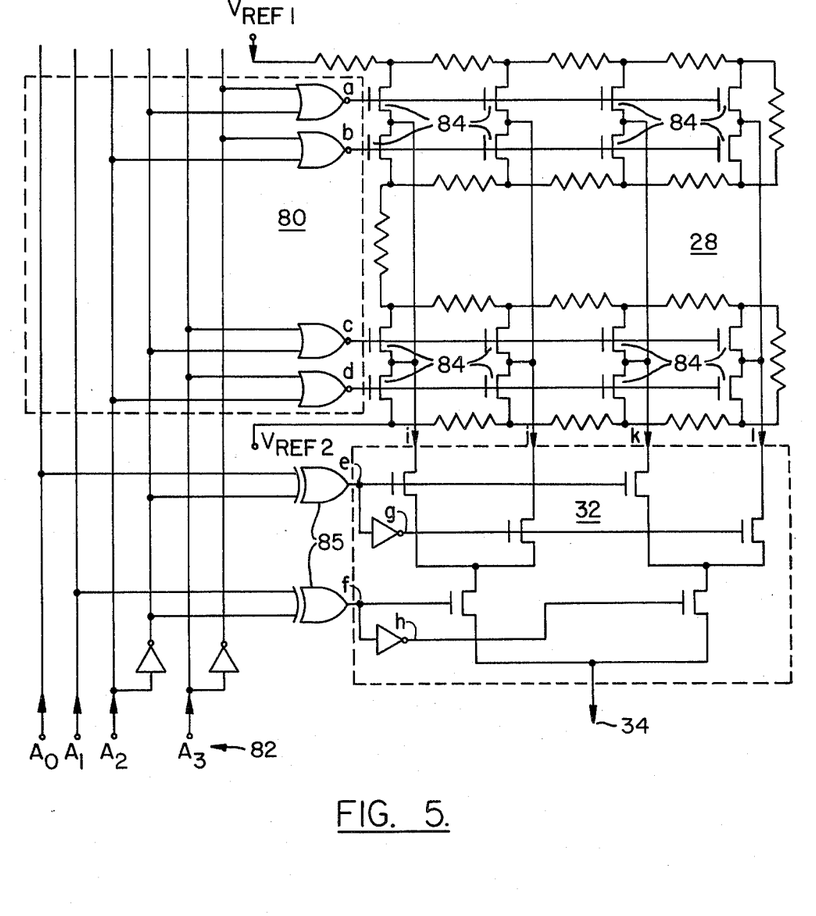
FIG. 5 is a schematic diagram of a compact digital-to-analog circuit according to the invention.
Figure 6:
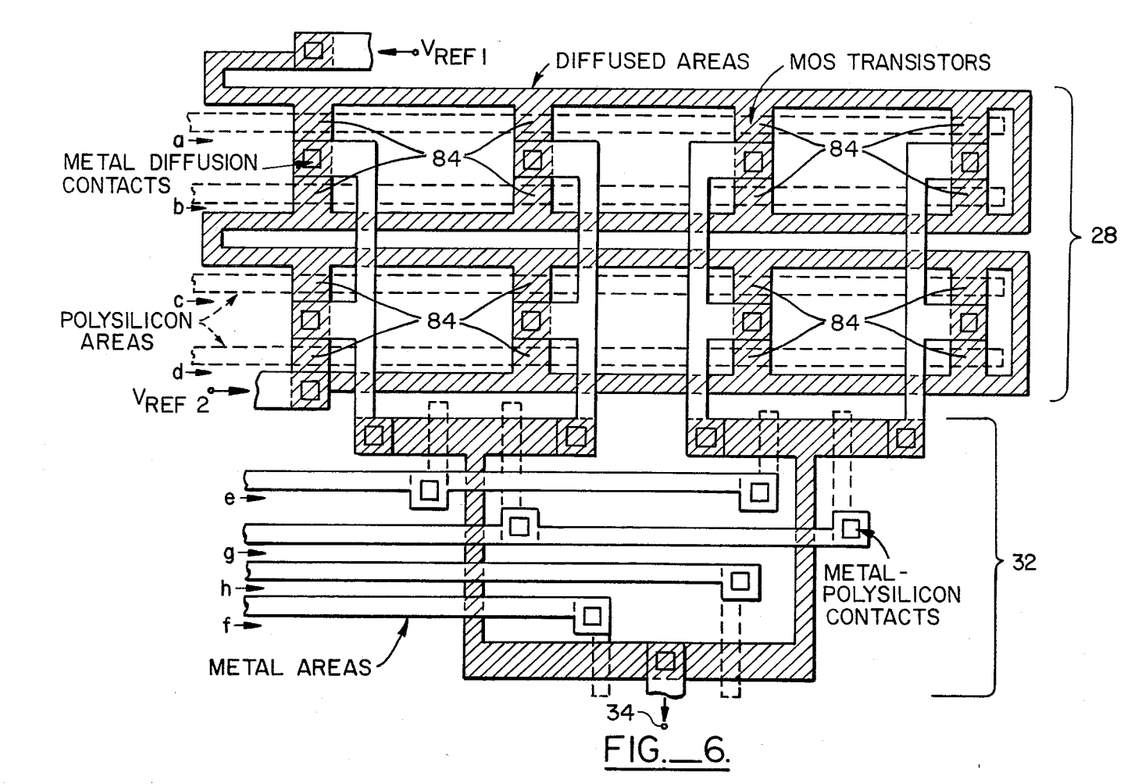
FIG. 6 is a top elevational view of a decoder and ladder of FIG. 5.

FIGS. 5 and 6 illustrate a specific embodiment of a compact resistor ladder 28 and tree decoder 32. FIG. 5 is a schematic diagram and FIG. 6 is a design layout of selected portions. In this embodiment, switch gate connections e, f, g, h from the digital input port 82 are physically disposed for connection to a plurality of switches 84 connected at a plurality of taps to the resistor ladder 28. The resistor ladder 28 is laid in a serpentine pattern so that the gate connections are laid out along parallel straight lines. Adjacent to the serpentine resistor ladder 28 is a one of four decoder 80 (it may be a one of N decoder). The one of four decoder 80 operates to activate one of a plurality of output lines through the resistor ladder 28 in response to a digital input word applied at a digital input port. Each one of the output lines activates only one specific row of gates on one leg of the serpentine resistor ladder 28. In this manner, only one leg of the resistor ladder is activated at any one time, so that the tree decoder operates only on one segment of the resistor ladder, thereby permitting the elimination of substantial numbers of transistors in the tree decoder. Still further, the physical layout of the MOS chip, in which the resistor ladder and decoder circuitries are constructed (FIG. 6), is formulated to minimize the number of crossovers and connections, which degrade the reliability of MOS-type circuits.

In order to assure that the tree decoder monotonically decodes the voltage references, one of the digital input lines of the one of four decoder is tied to a logic discriminator circuit through parallel EXCLUSIVE-OR gates 85. The EXCLUSIVE-OR gates 85 instruct the tree decoder 32 by appropriate logic to alternatively reverse the switching order from arm to arm of the resistor ladder. The X-Y decoder as shown is particularly useful in minimizing the resistors and switches required in a $2^N R$ type ladder and tree decoder.

The invention has now been explained with reference to specific embodiments. Other embodiments will be apparent to those of ordinary skill in the art. Accordingly, the invention is not to be interpreted as limiting except as indicated by the appended claims based on a reasonable interpretation of this specification.

What is claimed is:

1. An apparatus for converting a digital code of a plurality of digital signal lines into an analog signal value representative of said digital code wherein said analog signal value may have either a positive or negative polarity, said apparatus comprising:

a Metal Oxide Semiconductor silicon substrate including means for coupling said substrate to a ground reference as the substrate reference voltage $V_{ss}$;

a Metal Oxide Semiconductor resistor means disposed on said substrate in a series ladder having means for coupling a first end to a first analog voltage reference $V_{ref\,1}$ and a second opposing end to a second analog voltage reference $V_{ref\,2}$, such that said first analog voltage reference is of a higher voltage and of the same polarity as said second analog voltage reference and said substrate is reverse biased between said first analog voltage and said substrate reference voltage, said resistor means having a plurality of taps between said first end and said second end thereby to define a $2^N R$ ladder;

a first analog signal node upon said substrate, said first node coupling voltage signal lines through a first pair of analog switches to said first analog voltage reference and to said second analog voltage reference, said first pair of analog switches being coupled in inverting complement having its control input coupled to means for providing a sign bit of said digital signal lines;

a tree decoding means on said substrate coupling voltage signal lines between said taps and a second analog signal node through analog switches, said analog switches being coupled in pairs in inverting complement to means for providing bit values of said digital signal lines;

means on said substrate for conveying a signal representative of said voltage signal at said second node to an output terminal of said substrate; and amplifier means coupled to said first node and to said substrate output terminal, said amplifier means having a first input and a second input, said second input being responsive to a voltage signal applied to said second node for reproducing as an output a signal having an amplitude proportional to said voltage signal, and said first input being responsive to selected first and second voltage levels at said first node to establish the polarity of said signal applied to said second node.

2. The apparatus according to claim 1 wherein said resistor means is disposed in a serpentine pattern on said substrate, further comprising means for selectively activating said tree decoding means in a matrix.

3. The apparatus as claimed in claim 1 wherein said amplifier means is an operational amplifier having substantially linear negative feedback, and wherein said first node is coupled to the inverting input of said operational amplifier.

4. The apparatus as claimed in claim 1 wherein said amplifier is an operational amplifier having substantially linear negative feedback, and wherein said first node is coupled to the noninverting input of said operational amplifier.

5. The apparatus as claimed in claim 1 wherein said conveying means is a buffer amplifier on said substrate whereby the output impedance of said second node at said output terminal is reduced to match the input impedance of said amplifier means.

6. The apparatus as claimed in claim 1 coupled to generate a digital output from an analog input signal further including a comparator means and a successive approximation register means, wherein said analog output signal is coupled to a first input of said comparator means and wherein a second analog input signal is coupled to the second input of said comparator means, the output of said comparator means being coupled to said successive approximation register means.

7. The apparatus as claimed in claim 1 wherein said first analog voltage reference is constrained to a level sufficiently low so as to minimize voltage drop across said analog switches.

8. The apparatus as claimed in claim 7 wherein said second analog voltage reference is constrained to be in the common mode amplification range of said output buffer amplifier.

* * * * *

UNITED STATES PATENT AND TRADEMARK OFFICE
CERTIFICATE OF CORRECTION

PATENT NO. : 4,281,319

DATED : July 28, 1981

INVENTOR(S) : Ben D. Roberts, Jr., San Jose, Ca.

It is certified that error appears in the above-identified patent and that said Letters Patent are hereby corrected as shown below:

Column 8, line 23-24, "said output buffer amplifier" should be changed to --said amplifier means--.

Signed and Sealed this

Second Day of March 1982

[SEAL]

Attest:

Attesting Officer

GERALD J. MOSSINGHOFF

Commissioner of Patents and Trademarks